United States Patent [19]

Cook

[11] Patent Number: 5,406,029

[45] Date of Patent: Apr. 11, 1995

[54] ELECTRONIC PACKAGE HAVING A PURE METAL SKIN

[75] Inventor: Arnold J. Cook, Mt. Pleasant, Pa.

[73] Assignee: PCC Composites, Inc., Pittsburgh, Pa.

[21] Appl. No.: 79,129

[22] Filed: Jun. 17, 1993

Related U.S. Application Data

[63] Continuation of Ser. No. 859,648, Mar. 23, 1992, which is a continuation of Ser. No. 652,563, Feb. 8, 1991, abandoned.

[51] Int. Cl.⁶ ............................................. H05K 5/06
[52] U.S. Cl. ................................... 174/52.3; 257/703
[58] Field of Search ................. 174/35 R, 52.1, 52.3, 174/35 MS, 52.4; 257/701, 702, 703, 789, 795

[56] References Cited

U.S. PATENT DOCUMENTS

| | | | |
|---|---|---|---|
| 3,907,514 | 9/1975 | Demendi | 164/97 X |
| 4,828,008 | 5/1989 | White | 164/66.1 |
| 5,163,499 | 11/1992 | Newkirk | 164/98 |

Primary Examiner—Leo P. Picard
Assistant Examiner—Christopher Horgan
Attorney, Agent, or Firm—Ansel M. Schwartz

[57] ABSTRACT

The present invention pertains to an electronic package. The package has an internal portion having reinforcement, which is infiltrated with metal. There is a pure metal skin about the internal portion such that the internal portion is hermetically sealed. The metal skin is comprised purely of the metal infiltrated within the reinforcement and forms a continuum with the metal within the reinforcement.

10 Claims, 3 Drawing Sheets

ELECTRONIC PACKAGE HAVING A PURE METAL SKIN

This is a continuation application of U.S. patent application Ser. No. 07/859,648, filed Mar. 23, 1992, pending, which is a continuation of U.S. patent application, Ser. No. 07/652,563, filed Feb. 8, 1991, abandoned.

FIELD OF THE INVENTION

The present invention relates to the formation of a metal skin on a preform and metal matrix composite. More specifically, the present invention relates to the formation of metal skin on a preform by forced surface capillary action.

BACKGROUND OF THE INVENTION

In the production of metal matrix composites, it is normal to have reinforcement formed on the surface. Other production methods such as powder composite forming and squeeze casting, or pressureless infiltration leave reinforcement on the surface. In applications such as electronic packaging, the concept of a pure metal skin can solve problem of hermetic sealing, particle pull out, corrosion and surface finishes.

SUMMARY OF THE INVENTION

The present invention pertains to an electronic package. The package has an internal portion having reinforcement, which is infiltrated with metal. There is a pure metal skin about the internal portion such that the internal portion is hermetically sealed. The metal skin is comprised purely of the metal infiltrated within the reinforcement and forms a continuum with the metal within the reinforcement.

The present invention also relates to a method for creating a metal skin about a preform of fiber or particulate reinforcement. The method comprises the steps of placing the preform in a mold chamber in a pressure vessel. Then, there is the step of sealing the pressure vessel. Next, there is the step of causing molten metal in the pressure vessel to enter the mold chamber such that the molten metal, under surface capillary action, positions about the preform to form an essentially pure metal skin. In the alternative embodiment, before the causing step, there is the step of heating the metal to a temperature above its solidus temperature. The infiltrating step includes the step of heating the mold chamber, evacuating the mold chamber, and pressurizing the mold chamber such that the molten metal enters into the mold chamber flows around the preform and penetrates into the preform.

In a preferred embodiment, there is a method for creating a metal skin about a preform of fiber or particulate reinforcement. The method includes the step of isolating a vacuum in the preform area of the mold either by forming a liquid seal in the top fill process or by forming a solidification valve in the bottom fill process. Next, there is the step of increasing the hydrostatic pressure in the pressure vessel causing the liquid metal to follow the path of least resistance at the contact area between the mold surface and the preform. Next, there is the step of further increasing the pressure to a total applied pressure sufficient to overcome the threshold pressure for infiltration (caused by the lack of wettability between the preform the molten alloy) and viscous drag due to metal flowing into the evacuated spaces between fibers or particles in the preform. This applied pressure acting on the preform compresses the preform slightly and causes a uniformly thin, nonreinforced skin to from between the mold wall and the preform. The thickness of this skin is controlled by the applied pressure.

In another alternative embodiment to be used for fragile preforms, the skin can be formed by the placement of indexing particles of predetermined size so as to position the preform in the mold away from the mold wall so as to form a skin of the matrix alloy after solidification.

BRIEF DESCRIPTION OF THE DRAWINGS

In the accompanying drawings, the preferred embodiment of the invention and preferred methods of practicing the invention are illustrated in which.

DESCRIPTION OF THE PREFERRED EMBODIMENT

Figure 1A:
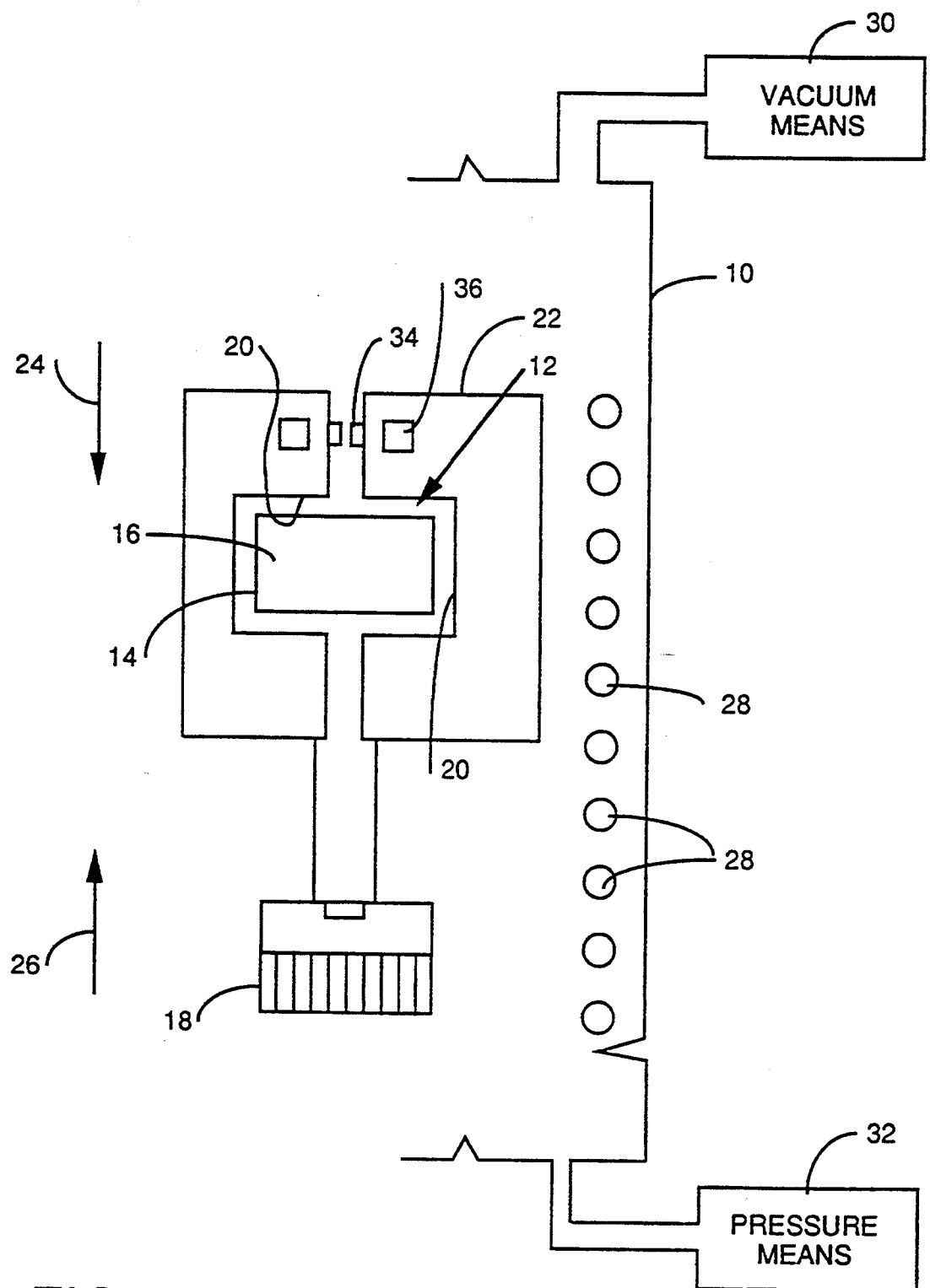
FIG. 1A is a schematic representation of a portion of an apparatus that can be utilized with the inventive method.
Figure 2:
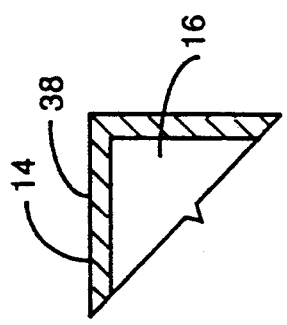
FIG. 2 is a partial cross sectional view of a preform with a skin.

Referring now to the drawings wherein like reference numerals refer to similar or identical parts throughout the several views, and more specifically to FIG. 1A thereof, there is shown a portion of a pressure vessel 10 with a mold chamber 12 therein. The method for creating a metal skin 14 about a preform 16 of fiber or particulate reinforcement comprises the steps of first placing the preform 16 in a mold chamber 12 in a pressure vessel 10. Then, there is the step of sealing the pressure vessel 10. Next, there is the step of causing molten metal 18 in the pressure vessel 10 to enter the mold chamber 12 such that the molten metal 18, under surface capillary action, positions about the preform 16 to form essentially a pure metal skin 14 as shown in FIG. 2. FIG. 2 is a partial cross sectional view of a preform 16 with the metal skin 14. The thickness of the skin is determined by the casting parameters, such as pressure application rate, maximum applied pressure and temperature, and the relationship between the mold 22 and preform 16. The preform 16 can have a volume fraction of 1% to 95%.

Preferably, the causing step includes the step of infiltrating the preform 16 with molten metal 18 from the mold wall 20 into the preform 16. Before the causing step, there can be the steps of heating the metal to a temperature above its solidus temperature and preferably its liquidus temperature.

The infiltrating step preferably includes the steps of heating the mold chamber 12, evacuating the mold chamber 12 and pressurizing the mold chamber 12 such that molten metal 18 enters the mold chamber 12, flows around the preform 16 and penetrate into the preform 16. The pressure in the vessel 10 can be 400–3,000 PSI. After the causing step, there is the step of removing the infiltrated preform 16 from the mold 22.

Preferably, after the pressurizing step, there is the step of solidifying the molten metal 18 infiltrated into the preform 16 in a first direction 24 towards a second direction 26 from which the molten metal 18 enters the mold chamber 12.

Before the placing step, there is preferably the step of coating the mold chamber 12 with a mold release agent to facilitate removal of the preform 16 from the mold 22 during the removing step. The mold release is preferably graphite. The coating step can include the step of spraying the mold chamber 12 with graphite, or can include the step of brushing the mold chamber 12 with graphite. Preferably, before the coating step, there is the step of polishing the mold chamber.

The metal that is provided to the mold chamber 12 to form the skin 14 can be, for instance, copper, silver, super alloys in intermetal binders, iron or preferably aluminum such as 6061 aluminum. The preform 16 can be, for instance, made of SiC.

In the operation of the preferred embodiment, a pressure vessel 10, such as that which can be obtained from PCast Equipment Corporation, Pittsburgh, Pa., and which is described in its sales brochure, has placed in a mold chamber 12 therein a preform 16 of SiC particulate reinforcement. Prior to the placement of the preform 16 therein, the mold chamber 12 is polished to provide a smooth surface for the skin 14 that will be formed on the preform, and also sprayed with a mold release agent of graphite (in the case of Al and Cu alloys) to facilitate the removal of the preform 16 from the mold 12 after the metal skin is formed and infiltration of the preform 16 is complete. Additionally, the graphite mold release facilitates the formation of the nonwetting mold surface in order to form the skin 14.

Once the preform 16 is in place, the pressure vessel 10 is sealed. Aluminum in the pressure vessel 10 is then melted by heating means 28. Heating means 28 also heats the mold chamber 12 to a temperature above the liquidus temperature of aluminum, between 650° and 700° C. Essentially, concurrent with the heating occurring in the pressure vessel 10 is the evacuation of the pressure vessel through a vacuum means 30 such as a pump. The vacuum means 30 serves to remove unwanted gases in the preform 16 which facilitates the complete infiltration of the preform 16 by the molten aluminum. It also draws the molten aluminum into the mold chamber 12.

After the aluminum is melted and either after or during the vacuum means 30 evacuates the pressure vessel 10, pressure means 32, such as a pump, pressurizes the pressure vessel 10 causing the molten aluminum to further fill the mold chamber 12. As the molten aluminum fills the mold chamber 22, it essentially first surrounds the preform 16 since that is the path of least resistance for the molten aluminum, as more fully described below. As the pressure in the mold chamber 12 further increases, the molten aluminum infiltrates and fills the interstices of the SiC preform 16. The particles comprising the SiC preform 16 are between 1 and 100 microns in size and have a volume fraction of approximately 65%. A pressure of approximately 1300 PSI is required to completely infiltrate the preform of SiC at the 1 $\mu$m, 65 volume fraction level and less for larger sized particulates.

After the preform 16 is infiltrated with molten aluminum, a solidification value comprised of a ceramic plug 34 and tubing 36 with water passing thereabout for cooling causes a directional solidification to begin in the molten aluminum. Molten aluminum that has infiltrated up to the solidification value under the action of pressure. A solidification front therefrom then passes through the infiltrated preform 16. During the directional solidification, the heating means 28, including either induction coils or resistance coils, is inactivated.

The infiltrated preform 16 is allowed to cool with the formation of a matrix alloy skin 14 thereabout. The graphite can then be cleaned from the metal skin 14. A surface finish of 2 to 10 microns of the reacted aluminum graphite surface 38 of the skin 14 is available immediately upon removal of the preform 16 with the metal skin 14 thereabout from the mold chamber 12. The skin 14 provides a hermetic seal which prevents corrosion of the preform 16.

Figure 3:
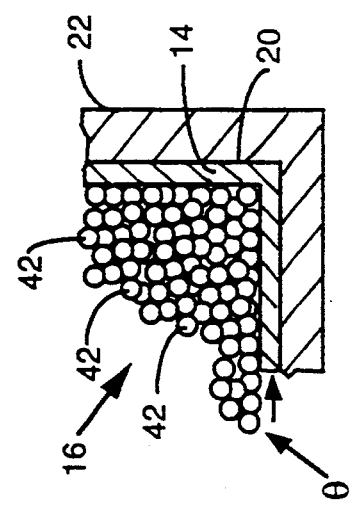
FIG. 3 is a partial schematic representation of a preform with a skin thereabout in a mold.

The metal enters the evacuated mold 22 and follows the path of least resistance which is between the mold inner surface 20 and the preform 16, as shown in FIG. 3. Since the ceramic fibers or particle are not wetted by most metals, a threshold pressure is required before the molten metal or alloy begins to infiltrate. Since flow through a preform causes viscous drag losses, an additional pressure is required to cause the metal to flow through the evacuated spaces between the ceramic particles or fibers. This combined pressure on the preform (capillary back pressure plus required viscous drag pressure) exerts a compression force on the preform which causes it to deform slightly in an inward direction with respect to the mold wall and causes a gap to form which, after solidification, becomes a particle or fiber free skin of the matrix alloy. The depth of the skin is controllable by the total applied pressure and the rate of pressure application.

Figure 1B:
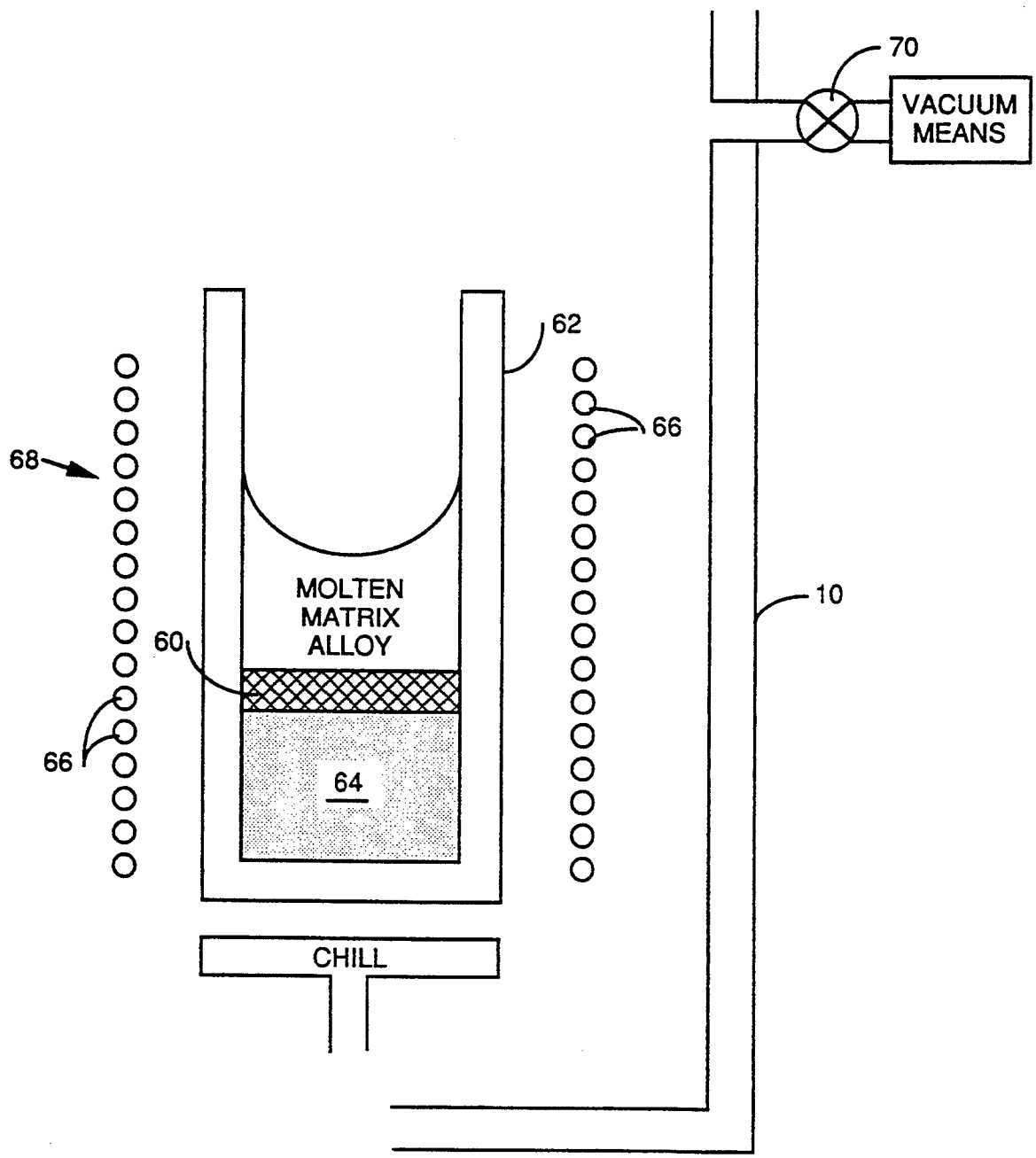
FIG. 1B is a schematic representation of an alternative modification of the apparatus that can be utilized with the inventive method.

Alternatively, the top fill approach of FIG. 1B can be used. In this embodiment, metal is either molten in situ or poured onto a filter 60. The pressure vessel 10 is evacuated prior to melting the metal or pouring molten metal into the mold 62. The preform 64 will also have been evacuated and heated to the desired preform temperature by heating element 66.

Prior to infiltration, the temperature of the melt is brought to the desired metal temperature utilizing the upper heating zone 68. To initiate infiltration, the vacuum valve 70 is closed and the vessel 10 is pressurized. Since the molten metal forms a gas tight seal with the mold wall, a vacuum is isolated within the mold vessel. This enables a pressure differential to be created. The increased pressure first causes the metal to infiltrate the filter 62, then the metal follows the path of least resistance around the preform 64. As the pressure builds up, the mold is compressed slightly, which forms a gap between the mold and the preform 64. With continuous pressurization, the metal completely infiltrates into the evacuated regions between fibers or particulates within the preform 64. At this point, the details of infiltration and formation of the skin is exactly the same as in the bottom fill embodiment described above.

Figure 4:
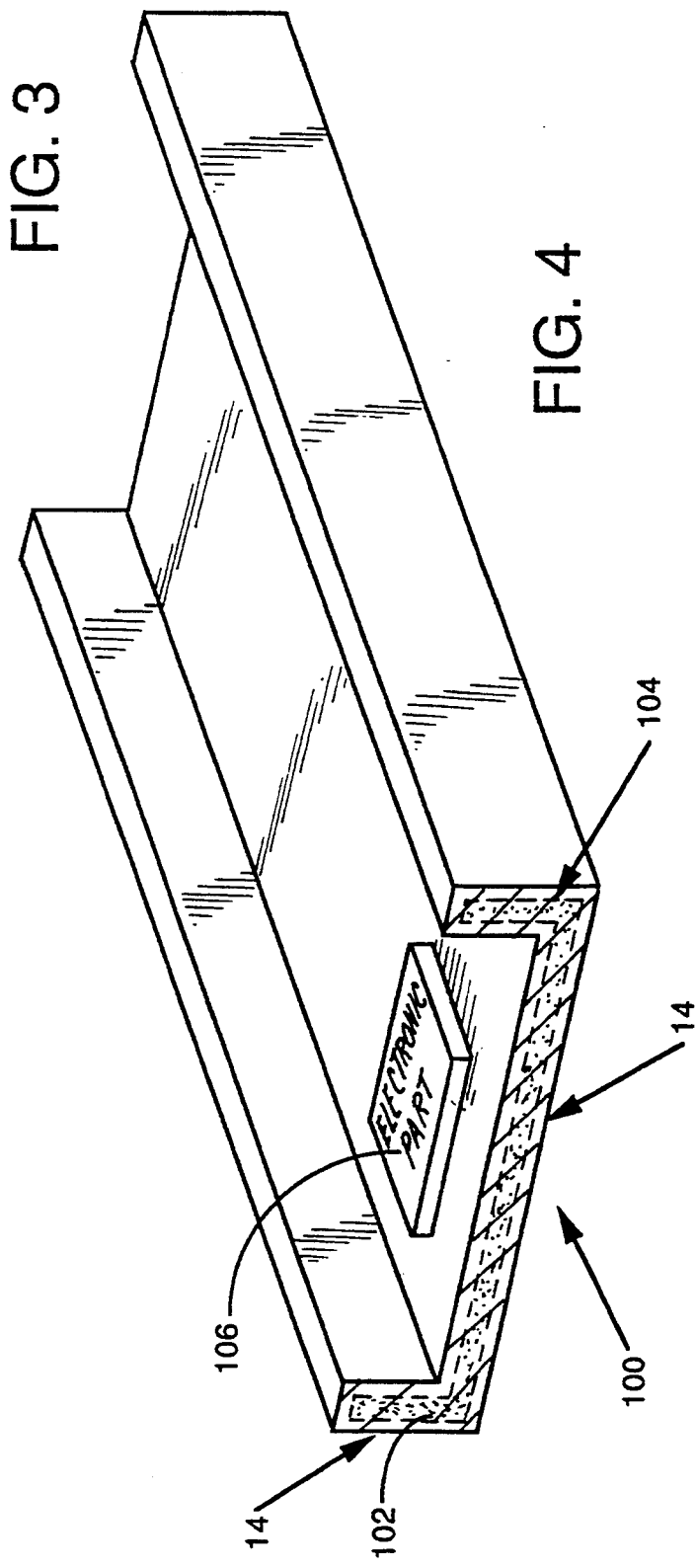
FIG. 4 is a schematic representation of an electronic package having a pure metal skin on which an electronic part is disposed.

As described in the background and as shown in FIG. 4, the previously described methods can be used to make an electronic package 100. The package 100 has an internal portion 102 having reinforcement 104, which is infiltrated with metal 18. There is a metal skin 14 formed about the internal portion 102 such that the internal portion 102 is hermetically sealed. The skin is devoid of reinforcement 104. Preferably, the metal skin 14 is comprised purely of the metal 18 infiltrated within the reinforcement 104 and forms a continuum with the metal 18 within the reinforcement 104. Preferably, the metal 18 is aluminum and the reinforcement 104 is comprised of SiC particles which range in size from 1 to 100 microns. The electronic package 100 is used for holding an electronic part 106, such as an integrated circuit or a chip or a semiconductor.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. An electronic package comprising:
an internal portion having reinforcement infiltrated with a metal; and
a metal skin completely surrounding said internal portion such that the internal portion is hermetically sealed, said metal skin comprised purely of said metal and forming a continuum with the metal infiltrated into the internal portion.

2. A package as described in claim 1 wherein the metal is comprised of aluminum or copper.

3. A package as described in claim 2 wherein the reinforcement includes particles.

4. A package as described in claim 2 wherein the reinforcement includes fibers.

5. A package as described in claim 3 wherein the reinforcement is comprised of SiC particles.

6. A package as described in claim 5 wherein the SiC particles range in size between 1 and 100 microns.

7. A package as described in claim 6 wherein the metal of the metal skin and the metal within the internal portion share a continuous crystal structure.

8. A package as described in claim 1 including an electronic part situated on the metal skin.

9. A package as described in claim 1 wherein the reinforcement comprises a preform.

10. A package as described in claim 1 having a surface finish of 2 to 10 microns thick.

* * * * *